United States Patent
Morimoto et al.

(10) Patent No.: US 10,296,024 B2
(45) Date of Patent: May 21, 2019

(54) SEMICONDUCTOR SWITCH CONTROL DEVICE

(71) Applicant: Yazaki Corporation, Tokyo (JP)

(72) Inventors: Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/621,746

(22) Filed: Jun. 13, 2017

(65) Prior Publication Data

US 2018/0004237 A1    Jan. 4, 2018

(30) Foreign Application Priority Data

Jul. 1, 2016    (JP) ................. 2016-131731

(51) Int. Cl.
| | |
|---|---|
| *H03K 17/08* | (2006.01) |
| *H03K 17/082* | (2006.01) |
| *G05D 23/20* | (2006.01) |
| *G05F 1/455* | (2006.01) |
| *H03K 17/723* | (2006.01) |

(Continued)

(52) U.S. Cl.
CPC ............ *G05F 1/455* (2013.01); *G05D 23/20* (2013.01); *H01L 29/66992* (2013.01); *H01L 29/74* (2013.01); *H03K 17/0822* (2013.01); *H03K 17/723* (2013.01); *H03K 17/94* (2013.01); *H03K 2017/0806* (2013.01); *H03K 2217/0054* (2013.01)

(58) Field of Classification Search
CPC . G05F 1/455; G05F 1/445; G05F 1/45; G05F 1/452; G05D 23/20; G05D 23/2033; G05D 23/2034; G05D 23/2035; G05D 23/2036; H03K 17/0822; H03K 17/0812; H03K 17/08122; H03K 2017/0806; H03K 2017/0054
USPC ........................................................ 327/454
See application file for complete search history.

(56) References Cited

U.S. PATENT DOCUMENTS 6,392,859 B1 * 5/2002 Ohshima ............. H01L 27/0248
                                                             361/100
2002/0118502 A1    8/2002 Yabe et al.

(Continued)

FOREIGN PATENT DOCUMENTS

| CN | 102842929 A | 12/2012 |
|---|---|---|
| CN | 104467468 A | 3/2015 |

(Continued)

OTHER PUBLICATIONS

Japanese Office Action for the related Japanese Patent Application No. 2016-131731 dated Jul. 3, 2018.

(Continued)

*Primary Examiner* — Patrick C Chen
(74) *Attorney, Agent, or Firm* — Kenealy Vaidya LLP (57) ABSTRACT

A semiconductor switch control device includes a first FET and a second FET arranged adjacent to each other, in which source terminals are connected in series. A drain terminal of the first FET is connected to a high voltage battery, and a drain terminal of the second FET is connected to a high voltage load. A controller determines a temperature state of a minus-side main relay including the second FET based on a forward voltage of a body diode of the first FET.

4 Claims, 5 Drawing Sheets

(51) Int. Cl.
*H01L 29/66* (2006.01)
*H01L 29/74* (2006.01)
*H03K 17/94* (2006.01)

(56) References Cited

U.S. PATENT DOCUMENTS

| | | | |
|---|---|---|---|
| 2003/0006228 A1* | 1/2003 | Nagatomo | B62D 1/065 |
| | | | 219/494 |
| 2009/0103223 A1* | 4/2009 | Prussmeier | H03K 17/0822 |
| | | | 361/93.9 |
| 2009/0202890 A1* | 8/2009 | Takeda | H01M 2/34 |
| | | | 429/62 |
| 2012/0326531 A1 | 12/2012 | Kawamoto et al. | |
| 2013/0120886 A1* | 5/2013 | Chen | H03K 3/00 |
| | | | 361/56 |
| 2015/0085544 A1 | 3/2015 | Otake et al. | |

FOREIGN PATENT DOCUMENTS

| | | |
|---|---|---|
| JP | H11-146558 A | 5/1999 |
| JP | 2003-019964 A | 1/2003 |
| JP | 2004-117260 A | 4/2004 |
| JP | 2008-052564 A | 3/2008 |
| JP | 2012-235629 A | 11/2012 |
| JP | 2014-039220 A | 2/2014 |
| JP | 2015-095442 A | 5/2015 |

OTHER PUBLICATIONS

Chinese Office Action for the related Chinese Patent Application No. 201710516844.5 dated Aug. 28, 2018.

* cited by examiner

SEMICONDUCTOR SWITCH CONTROL DEVICE

CROSS-REFERENCE TO RELATED APPLICATION(S)

The present application claims priority to and incorporates by reference the entire contents of Japanese Patent Application No. 2016-131731 filed in Japan on Jul. 1, 2016.

BACKGROUND OF THE INVENTION

1. Field of the Invention

The present invention relates to a semiconductor switch control device.

2. Description of the Related Art

Conventional, electric vehicles, hybrid electric vehicles, and the like are equipped with a high voltage load such as a drive motor and a high voltage battery for driving the high voltage load, and switches for conducting or blocking a current flowing from the high voltage battery to the high voltage load for the purpose of security. As such switches, mechanical relays are mainly used. However, in recent years, it is considered for the switches to use semiconductor switches (for example, in Japanese Patent Application Laid-Open No. 2012-235629).

Since the temperature of a semiconductor switch increases due to heat generation by electrical conduction, it is necessary to determine the temperature state of the semiconductor switch and to suppress an increase in temperature. However, there is room for improvement in determining the temperature state of the semiconductor switch.

SUMMARY OF THE INVENTION

An object of the present invention is therefore to provide a semiconductor switch control device capable of accurately determining a temperature state of a semiconductor switch.

In order to achieve the above mentioned object, a semiconductor switch control device according to one aspect of the present invention includes a semiconductor switch module provided between a power supply and a load and configured to conduct or block a current flowing between the power supply and the load, and a controller that controls the semiconductor switch module, wherein the semiconductor switch module includes a forward switch having a body diode arranged in a forward direction which is a direction in which the current flows and a backward switch arranged adjacent to the forward switch and having a body diode arranged in a direction opposite to the direction in which the current flows, in the forward switch and the backward switch, each of which includes a source terminal and a drain terminal, the source terminals are connected in series to each other, one drain terminal is connected to the power supply and the other drain terminal is connected to the load, or the drain terminals are connected in series to each other, one source terminal is connected to the power supply and the other source terminal is connected to the load, and the controller determines a temperature state of the semiconductor switch module based on a forward voltage of the body diode of the forward switch.

According to another aspect of the present invention, in the semiconductor switch control device, the controller determines a temperature state of the semiconductor switch module from a temperature of the body diode of the forward switch obtained based on a forward voltage of the body diode of the forward switch and a current flowing in the forward switch.

According to still another aspect of the present invention, the semiconductor switch control device may further include; a precharge circuit that controls the backward switch and allows a constant precharge current to flow, wherein in a case where precharge control is performed by the precharge circuit, the controller may determine a temperature state of the semiconductor switch module from the forward voltage of the body diode of the forward switch and a threshold value to determine the temperature of the body diode of the forward switch.

According to still another aspect of the present invention, in the semiconductor switch control device, in a case where the forward voltage of the body diode of the forward switch is out of a range of a reference voltage which is a reference of the forward voltage before determining the temperature state of the semiconductor switch module, the controller may determine that the forward switch has a failure and turns off the backward switch to block the current.

According to still another aspect of the present invention, in the semiconductor switch control device, in a case where the forward voltage of the body diode of the forward switch is out of a range of a reference voltage which is a reference of the forward voltage before determining the temperature state of the semiconductor switch module, the controller may determine that the forward switch has a failure and turns off the backward switch to block the current.

According to still another aspect of the present invention, in the semiconductor switch control device, in a case where the forward voltage of the body diode of the forward switch is out of a range of a reference voltage which is a reference of the forward voltage before determining the temperature state of the semiconductor switch module, the controller may determine that the forward switch has a failure and turns off the backward switch to block the current.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments according to the present invention will be described hereinafter in detail with reference to the accompanying drawings. The present invention is not limited to contents described in the following embodiments. In addition, the components described below include those can be easily assumed by the those skilled in the art and substantially the same components. In addition, the configurations described below can be appropriately combined. In addition, various omissions, substitutions, or changes in the configuration can be implemented within the scope without departing from the gist of the present invention.

First Embodiment

Figure 1:
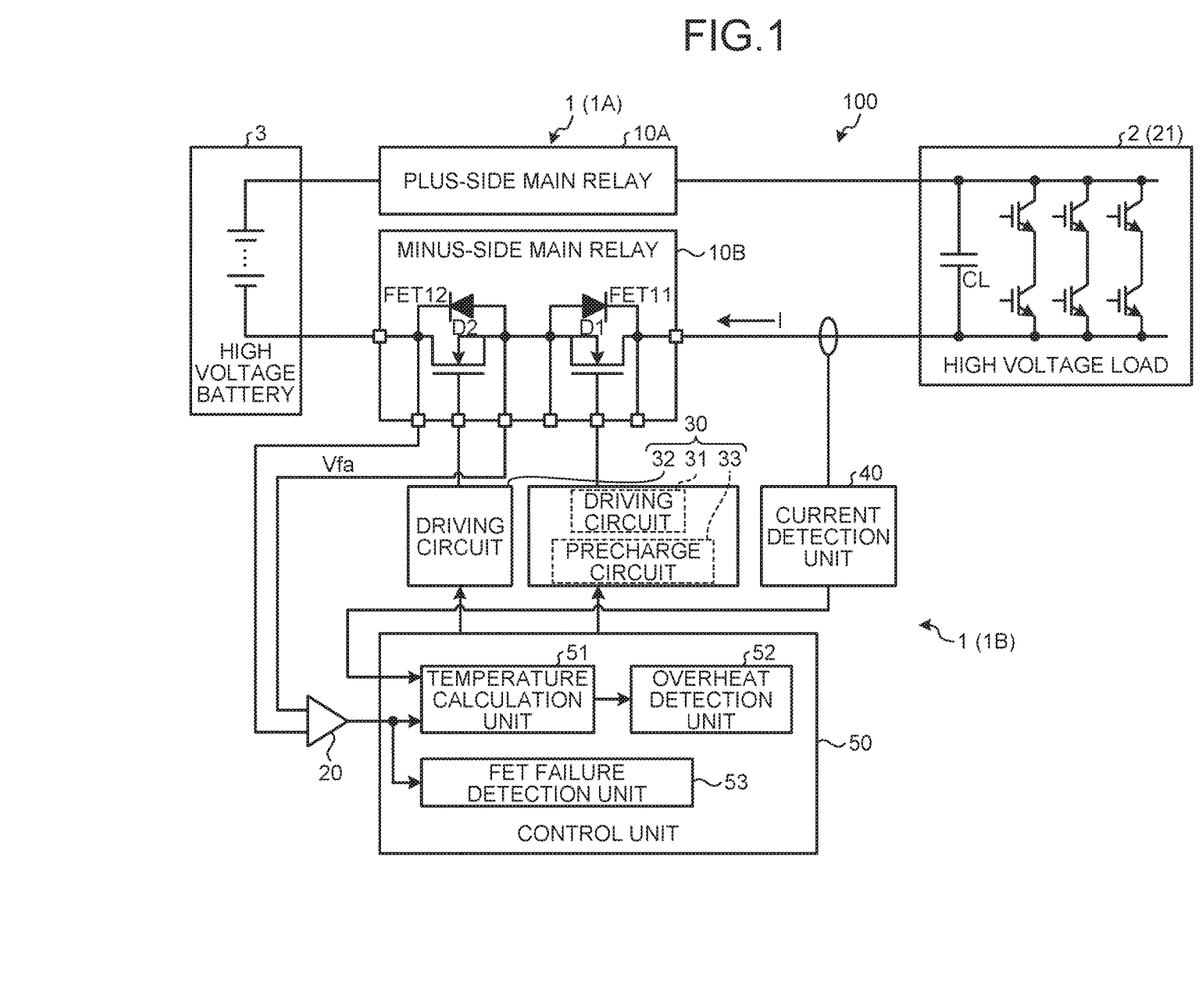
FIG. 1 is a block diagram illustrating an example of a configuration of a semiconductor switch control device according to a first embodiment.

As illustrated in FIG. 1, a vehicle power supply system 100 such as an electric vehicle or a hybrid electric vehicle includes a high voltage load 2 as a load such as an inverter 21 that converts a direct current to an alternating current and supplies power to a drive motor, a high voltage battery 3 as a power supply for driving the high voltage load 2, and a semiconductor switch control device 1 (1A, 1B) to conduct or block a current flowing between the high voltage battery 3 and the high voltage load 2 for the purpose of security.

The semiconductor switch control device 1A according to a first embodiment is provided on a plus electrode side of the high voltage battery 3 and switches a plus-side main relay 10A as a semiconductor switch module to conduct or block the current flowing from the high voltage battery 3 into the high voltage load 2. The semiconductor switch control device 1B is provided on a minus electrode side of the high voltage battery 3 and switches a minus-side main relay 10B as a semiconductor switch module to conduct or block a current flowing from the high voltage load 2 to the high voltage battery 3. The semiconductor switch control device 1A has a configuration similar to that of the semiconductor switch control device 1B and controls similarly, and thus, detailed description thereof will be omitted. Hereinafter, the semiconductor switch control device 1B will be described. The semiconductor switch control device 1B is configured to include the minus-side main relay 10B, a differential amplifier circuit 20, a driving circuit section 30, a current detector 40, and a controller 50.

The minus-side main relay 10B is provided between the minus electrode side of the high voltage battery 3 and the high voltage load 2 to conduct or block a current flowing from the high voltage load 2 to the minus electrode side of the high voltage battery 3. In addition, in the upstream side of the minus-side main relay 10B, the plus-side main relay 10A is provided. The plus-side main relay 10A is provided between the plus electrode side of the high voltage battery 3 and the high voltage load 2 to conduct or block a current flowing from the plus electrode side of the high voltage battery 3 to the high voltage load 2.

The minus-side main relay 10B is configured to include an FET (Field-Effect Transistor) 11 and an FET 12. The FETs 11 and 12 are, for example, N-channel MOS (Metal-Oxide-Semiconductor) FETs. The FET 11 is a backward switch having a body diode (parasitic diode) D1 arranged in a direction opposite to the direction in which a current I (hereinafter, also referred to as a forward current I (Ia, Ib) unless otherwise specified) flowing from the high voltage load 2 to the minus electrode side of the high voltage battery 3 flows. The anode terminal of the body diode D1 is connected to the minus electrode side of the high voltage battery 3, and the cathode terminal thereof is connected to the high voltage load 2 side. The FET 11 is driven by a driving circuit section 30 described later to conduct or block the current I flowing from the high voltage load 2 to the minus electrode side of the high voltage battery 3. The FET 12 is an FET similar to the FET 11 and is a forward switch where a body diode D2 is arranged in a forward direction that is the direction in which the current I flows. The cathode terminal of the body diode D2 is connected to the minus electrode side of the high voltage battery 3, and the anode terminal thereof is connected to the high voltage load 2 side. The FET 12 is driven by the driving circuit section 30, and a junction temperature (hereinafter, referred to as a temperature, simply) which is the temperature of the junction of the body diode D2 is measured based on a forward voltage Vfa of the body diode D2. Here, the forward voltage Vfa of the body diode D2 indicates the voltage drop (potential difference) of the body diode D2 in a case where the forward current I flows. The FET 11 and the FET 12 are arranged adjacent to each other, source terminals thereof are connected in series, the drain terminal of the FET 12 is connected to the high voltage battery 3, and the drain terminal of the FET 11 is connected to the high voltage load 2. For example, the FET 11 and the FET 12 are arranged side by side in a proximate state and are mounted on the board in a state modularized by bare-chip mounting or sealing with resin and being mounted by resin.

The differential amplifier circuit 20 outputs the forward voltage Vfa of the body diode D2 of the FET 12. The differential amplifier circuit 20 is connected to the anode terminal and the cathode terminal of the body diode D2 and amplifies the potential difference between the anode terminal side and the cathode terminal side to output the potential difference as the forward voltage Vfa to the controller 50.

The driving circuit section 30 is configured to include a driving circuit 31 driving the FET 11, a driving circuit 32 driving the FET 12, and a precharge circuit 33 controlling precharge of the FET 11. The driving circuit 31 is connected to a gate terminal of the FET 11 and applies an ON voltage to the gate terminal of the FET 11 as a control to turn on the switch of the FET 11, so that a current flows from the drain terminal to the source terminal. In addition, the driving circuit 31 applies an OFF voltage to the gate terminal of the FET 11 as a control to turn off the switch of the FET 11, so that the current flowing from the drain terminal to the source terminal is blocked. The driving circuit 32 is connected to the gate terminal of the FET 12 and applies an ON voltage to the gate terminal of the FET 12 as a control to turn on the switch of the FET 12, so that a current is allowed to flow from the source terminal to the drain terminal. In addition, the driving circuit 32 applies an OFF voltage to the gate terminal of the FET 12 as a control to turn off the switch of the FET 12, so that the current flowing from the source terminal to the drain terminal is blocked.

The precharge circuit 33 prevents an inrush current flowing from the high voltage battery 3 to the high voltage load 2 when actuating a high voltage circuit having the high voltage battery 3 and the high voltage load 2. The precharge circuit 33 is connected to the gate terminal of the FET 11 and applies a precharge voltage to the gate terminal of the FET 11, so that a constant precharge current flows. For example, the precharge circuit 33 allows a precharge current to flow only while charging a capacitor CL of the inverter 21 of the high voltage load 2.

The current detector 40 detects the forward current I flowing between the high voltage battery 3 and the high voltage load 2. For example, the current detector 40 detects the forward current I flowing between the minus-side main relay 10B and the high voltage load 2 and outputs a current value of the detected forward current I to the controller 50.

Figure 2:
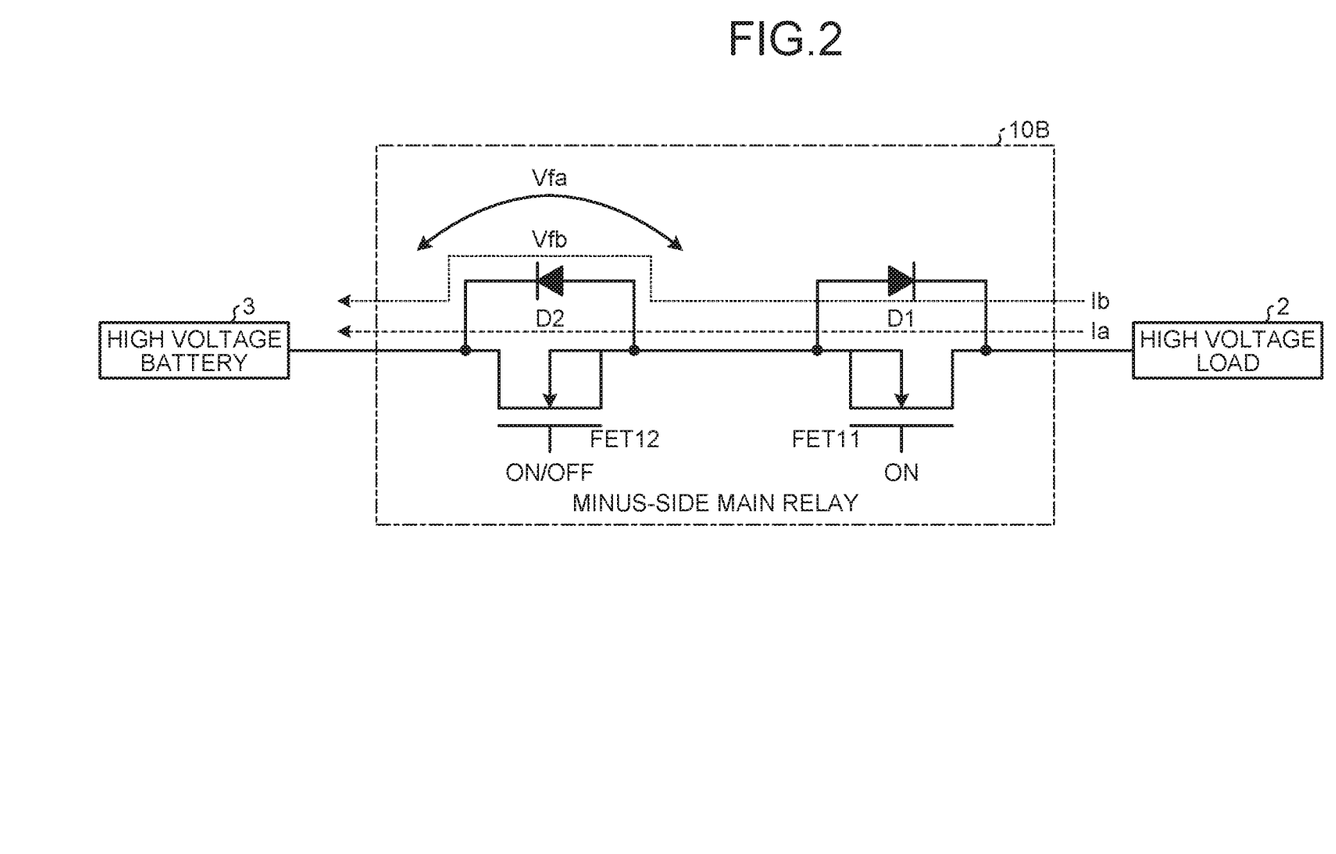
FIG. 2 is a diagram illustrating an example of control of an FET according to the first embodiment.

The controller 50 controls the minus-side main relay 10B through the driving circuit section 30. The controller 50 is configured to include an electronic circuit mainly configured with a well-known microcomputer including a CPU, a ROM, a RAM constituting a storage unit, and an interface. The controller 50 has an abnormality diagnosis mode of diagnosing abnormality of the minus-side main relay 10B. The controller 50 executes the abnormality diagnosis mode with a predetermined cycle. In the case where the controller 50 is not in the abnormality diagnosis mode, as illustrated in FIG. 2, the controller 50 sets the FET 11 to ON and sets the FET 12 to ON to pass the forward current Ia between the source terminal and the drain terminal of the FETs 11 and 12, so that the forward current Ia flows from the high voltage load 2 to the high voltage battery 3. In the abnormality diagnosis mode, the controller 50 sets the FET 11 to ON and sets the FET 12 to OFF to pass the forward current Ib between the source terminal and the drain terminal of the FET 11 and to pass the forward current Ib through the body diode D2 of the FET 12 without passing between the source terminal and the drain terminal of the FET 12, so that the forward current Ib flows from the high voltage load 2 to the high voltage battery 3. At this time, the controller 50 determines the temperature state of the FET 11 (minus-side main relay 10B) from the temperature of the body diode D2 obtained based on the forward voltage Vfa of the body diode D2 and the forward current Ib. In addition, the controller 50 determines a failure of the FET 12 based on the forward voltage Vfa of the body diode D2.

Figure 3:
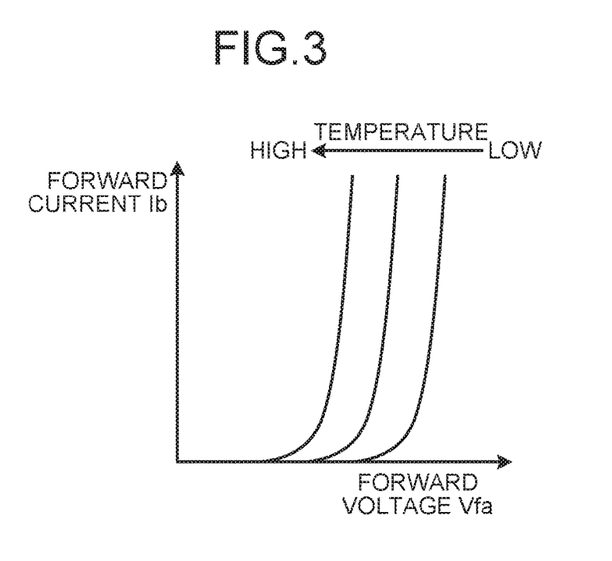
FIG. 3 is a diagram illustrating a forward characteristic map according to the first embodiment.

Specifically, the controller 50 is configured to include a temperature calculator 51, an overheat detector 52, and an FET failure detector 53. The temperature calculator 51 calculates the temperature of the body diode D2 of the FET 12. The temperature calculator 51 calculates the temperature of the body diode D2 based on the forward voltage Vfa and the forward current Ib of the FET 12. For example, as illustrated in FIG. 3, the temperature calculator 51 stores a forward characteristic map (K factor) indicating forward characteristics of the body diode D2 in the storage unit. The forward characteristic map illustrates a relationship between the forward voltage Vfa, the forward current Ib, and the temperature. In the forward characteristic map, the vertical axis indicates the forward current Ib, the horizontal axis indicates the forward voltage Vfa, and the temperature is illustrated in a range determined from the forward current Ib and the forward voltage Vfa. In the forward characteristic map, the temperature of the body diode D2 is determined from the forward voltage Vfa of the body diode D2 and the forward current Ib. For example, in the forward characteristic map, at a certain current value of the forward current Ib, the temperature of the body diode D2 tends to be higher as the forward voltage Vfa is lower. The temperature calculator 51 calculates the temperature of the body diode D2 from the forward voltage Vfa and the forward current Ib with reference to the forward characteristic map and outputs the calculation result to the overheat detector 52. In addition, in the first embodiment, although the temperature calculator 51 calculates the temperature of the body diode D2 by using the forward characteristic map, the temperature calculator 51 is not limited thereto.

The overheat detector 52 detects the temperature state of the FET 12 (the minus-side main relay 10B). The overheat detector 52 compares the temperature of the body diode D2 with a temperature threshold value of the body diode D2. Here, the temperature threshold value of the body diode D2 is a value for determining whether or not the FET 12 is in an overheated state and is set in advance on the basis of experiments and the like. In a case where the temperature of the body diode D2 exceeds the temperature threshold value, the overheat detector 52 determines that the FET 12 is in an overheated state. In addition, in a case where the temperature of the body diode D2 is equal to or lower than the temperature threshold value, the overheat detector 52 determines that the FET 12 is in an appropriate temperature state. In a case where the FET 12 is overheated, the controller 50 can determine (estimate) that the FET 11 arranged adjacent to the FET 12 is also in an overheated state. This is because similar FETs are used for the FET 11 and the FET 12 and the FETs are modularized in the adjacent state. In a case where it is determined that the FET 11 is in an overheated state, the controller 50 controls the driving circuit 31 to set the FET 11 to OFF, so that the current flowing from the drain terminal of the FET 11 to the source terminal is blocked. On the other hand, in a case where the FET 12 is in an appropriate temperature state, the controller 50 can determine (estimate) that the FET 11 is also in an appropriate temperature state. In a case where it is determined that the FET 11 is in an appropriate temperature state, the controller 50 continues to turn on the FET 11.

The FET failure detector 53 detects a failure of the minus-side main relay 10B. The FET failure detector 53 compares the forward voltage Vfa of the body diode D2 with the reference voltage Vfb serving as a reference of the forward voltage Vfa. In a case where the forward voltage Vfa of the body diode D2 is outside the range of the reference voltage Vfb, the FET failure detector 53 determines that the FET 12 has a failure. Here, the reference voltage Vfb is a range in which the forward voltage Vfa of the normal body diode D2 changes. In a case where the FET 12 has a failure, the controller 50 controls the driving circuit 31 to set the FET 11 to OFF. On the other hand, in a case where the forward voltage Vfa of the body diode D2 is within the range of the reference voltage Vfb, the FET failure detector 53 determines that the FET 12 does not have a failure. In a case where the FET 12 does not have a failure, the controller 50 determines the temperature state of the FET 11.

Figure 4:
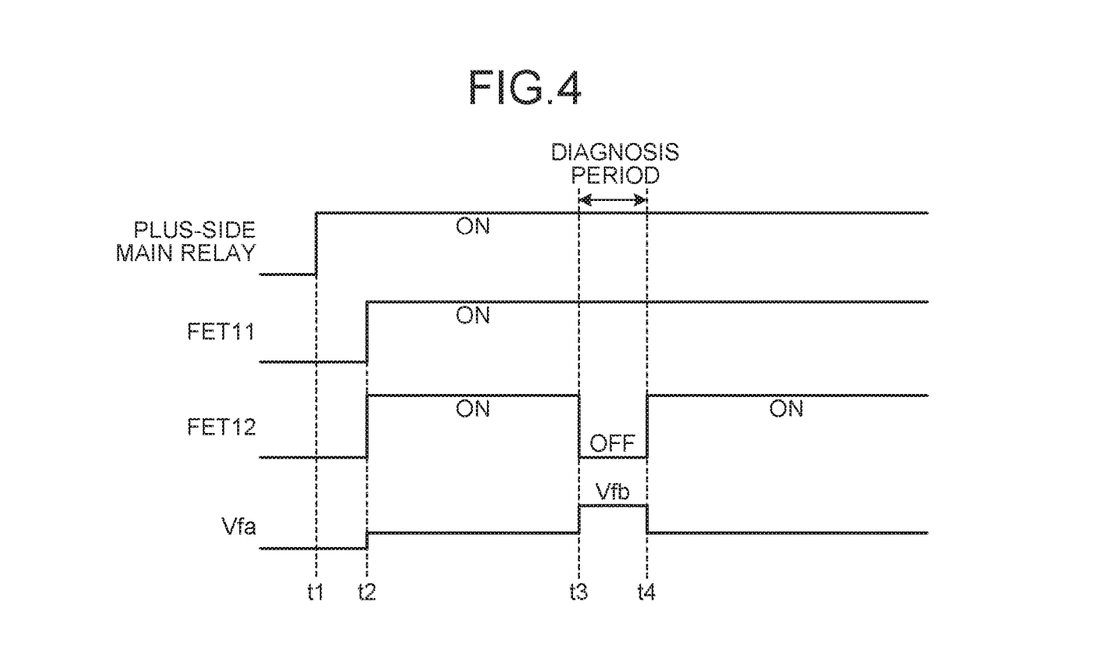
FIG. 4 is a timing chart illustrating an example of operations of the semiconductor switch control device according to the first embodiment.
Figure 5:
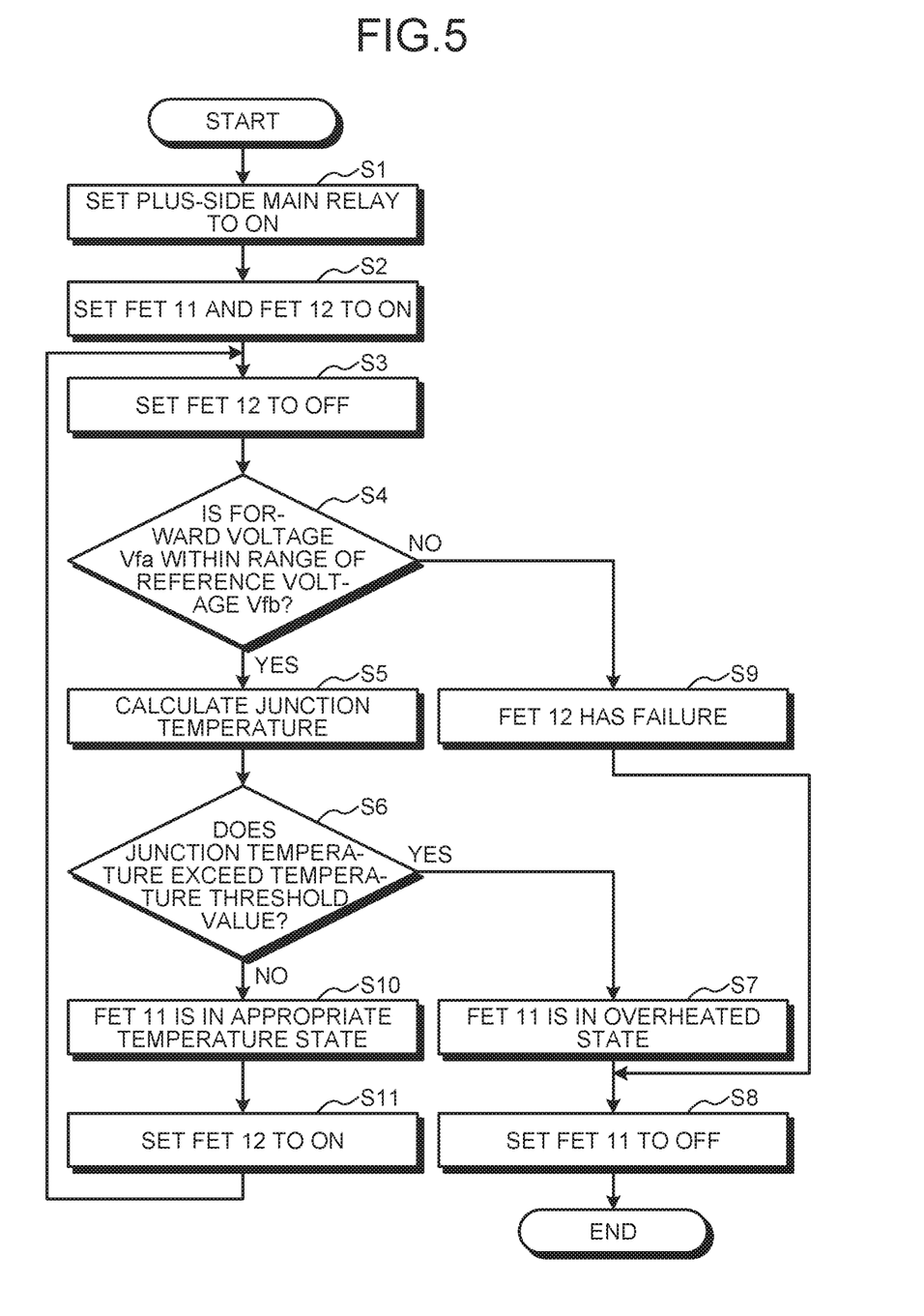
FIG. 5 is a flowchart illustrating an example of operations of the semiconductor switch control device according to the first embodiment.

Next, an example of operations of the semiconductor switch control device 1B will be described with reference to FIGS. 4 and 5. At time t1 illustrated in FIG. 4, the controller 50 sets the plus-side main relay 10A to ON (step S1). Next, the controller 50 sets the FET 11 and the FET 12 of the minus-side main relay 10B to ON at time t2 (step S2). Next, the controller 50 sets the FET 12 to OFF at the start time t3 of the abnormality diagnosis mode (step S3). Next, the controller 50 determines whether or not the forward voltage Vfa of the body diode D2 is within the range of the reference voltage Vfb (step S4). In a case where the forward voltage Vfa of the body diode D2 is within the range of the reference voltage Vfb (step S4; Yes), the controller 50 calculates the junction temperature of the body diode D2 (step S5). For example, the controller 50 calculates the temperature of the body diode D2 from the forward voltage Vfa and the forward current Ib of the body diode D2 with reference to the forward characteristic map. Next, the controller 50 determines whether or not the junction temperature of the body diode D2 exceeds the temperature threshold value (step S6). In a case where the junction temperature of the body diode D2 exceeds the temperature threshold value (step S6; Yes), the controller 50 determines that the FET 11 is overheated (step S7). Namely, in a case where the junction temperature of the body diode D2 exceeds the temperature threshold value, the controller 50 determines that the FET 12 is overheated, and also determines (estimates) that the FET 11 arranged adjacent to the FET 12 is also overheated. Next, the controller 50 sets the FET 11 to OFF and blocks the current I flowing from the high voltage load 2 to the minus electrode side of the high voltage battery 3 (step S8), and ends the process. At this time, the controller 50 informs the driver of the vehicle by using a notification unit such as an in-vehicle warning light (not illustrated).

In a case where it is determined in the above-described step S4 that the forward voltage Vfa of the body diode D2 is outside the range of the reference voltage Vfb (step S4; No), the controller 50 determines that the FET 12 has a failure (step S9). The controller sets the FET 11 to OFF so as to block the current I flowing from the high voltage load 2 to the minus electrode side of the high voltage battery 3 (step S8), and the process is completed. In addition, in a case where it is determined in the above-described step S6 that the junction temperature of the body diode D2 is equal to or lower than the temperature threshold value (step S6; No), the controller 50 determines that the FET 11 is in an appropriate temperature state (step S10). At time t4, the controller switches the FET 12 from OFF to ON (step S11), and the abnormality diagnosis mode is executed again at a predetermined cycle (step S3).

As described above, in the semiconductor switch control device 1 (1A, 1B) according to the first embodiment, the FET 11 and the FET 12 are arranged adjacent to each other, the source terminals thereof are connected in series, the drain terminal of the FET 12 is connected to the high voltage battery 3, and the drain terminal of the FET 11 is connected to the high voltage load 2. Then, the controller 50 determines the temperature state of the FET 11 (the minus-side main relay 10B) based on the forward voltage Vfa of the body diode D2 of the FET 12.

This makes it possible for the semiconductor switch control device 1 to accurately determine the temperature state of the FET 11 based on the junction temperature of the body diode D2 as compared with the case where the temperature around the semiconductor switch is measured by a conventional thermistor or the like. In the related art, since the temperature around the semiconductor switch is measured by a thermistor or the like, the thermal design is performed based on the value of thermal resistance of the package of the semiconductor switch. However, in this case, it is necessary to secure a sufficient margin, and the performance of the semiconductor switch cannot be fully acquired. On the contrary, since the semiconductor switch control device 1 can determine the junction temperature of the FET 11 based on the temperature of the body diode D2 of the FET 12, there is no need to take a large margin in the thermal design of the FET 11, and the performance of the FET 11 can be securely acquired. In addition, although the FET 11 and the FET 12 are arranged adjacent to each other, the closer the FET 11 and the FET 12 are, the more accurately the junction temperature of the FET 11 can be determined.

In addition, the semiconductor switch control device 1 determines the temperature state of the FET 11 from the temperature of the body diode D2 obtained based on the forward voltage Vfa of the body diode D2 of the FET 12 and the forward current Ib flowing through the FET 12. Therefore, the semiconductor switch control device 1 can determine the temperature state of the FET 11 based on the junction temperature of the body diode D2 calculated based on the forward voltage Vfa of the body diode D2 and the forward current Ib.

In a case where the forward voltage Vfa of the body diode D2 of the FET 12 is out of the range of the reference voltage Vfb as a reference of the forward voltage Vfa, the semiconductor switch control device 1 determines that the FET 12 has a failure and sets the FET 11 to OFF. Therefore, the semiconductor switch control device 1 can prevent the overheat state of the FET 11 from being determined in the state where the temperature of the body diode D2 cannot be measured due to the failure of the FET 12.

In addition, although the semiconductor switch control device 1 determines the temperature state of the FET 11 based on the forward voltage Vfa, the temperature state of the minus-side main relay 10B including the FET 11 may be determined.

Second Embodiment

Figure 6:
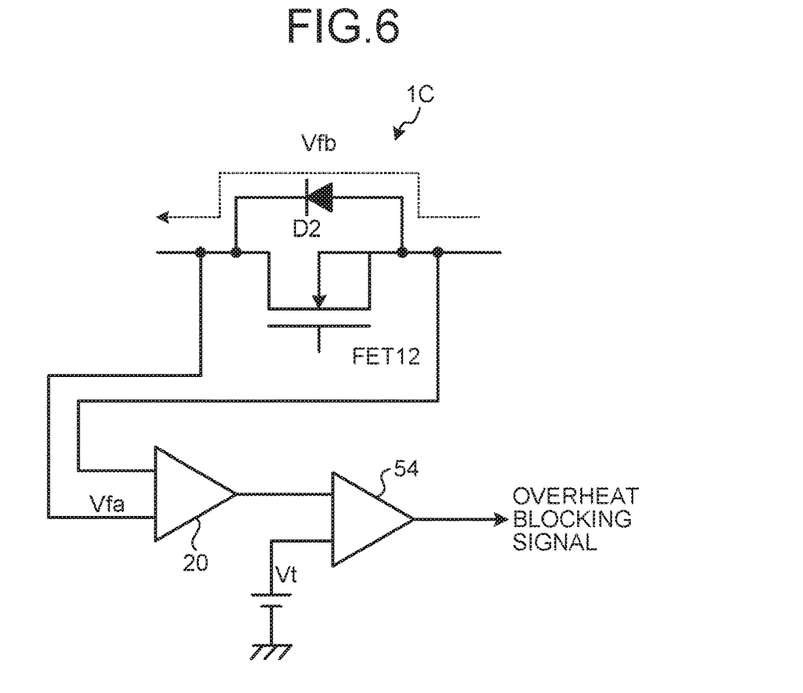
FIG. 6 is a block diagram illustrating an example of a configuration of main components of a semiconductor switch control device according to a second embodiment.
Figure 7:
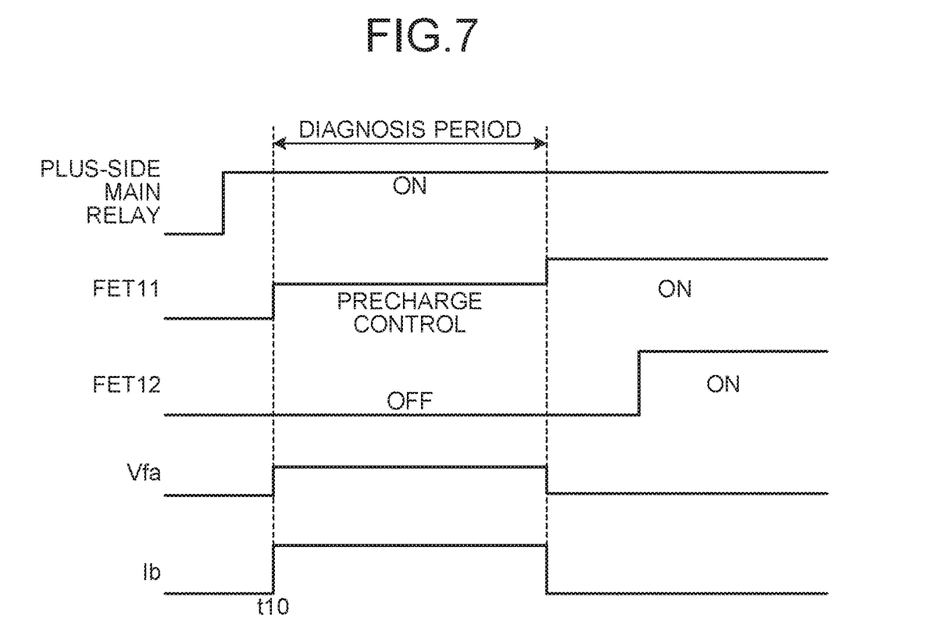
FIG. 7 is a timing chart illustrating an example of operations of the semiconductor switch control device according to the second embodiment.

Next, a semiconductor switch control device 1C according to a second embodiment will be described. In the semiconductor switch control device 1C according to the second embodiment, the same components as those of the semiconductor switch control device 1 of the first embodiment are denoted by the identical reference numerals, and detailed description thereof will be omitted. This embodiment is different from the first embodiment in that, in a case where the precharge control is performed by the precharge circuit 33, the semiconductor switch control device 1C determines the temperature of the body diode D2 from the forward voltage Vfa of the body diode D2 of the FET 12 without using the forward current Ib. The semiconductor switch control device 1C is configured to include a comparator 54 instead of the temperature calculator 51 and the overheat detector 52. As illustrated in FIG. 6, the comparator 54 compares the forward voltage Vfa of the body diode D2 output from the differential amplifier circuit 20 with the voltage threshold value Vt that determines the temperature of the body diode D2 and outputs the comparison result. Here, the voltage threshold value Vt is preset on the basis of, for example, the magnitude of a precharge current. The comparator 54 compares the forward voltage Vfa of the body diode D2 with the voltage threshold value Vt of the body diode D2. In a case where the forward voltage Vfa of the body diode D2 is lower than the voltage threshold value Vt, since the temperature of the body diode D2 is relatively high, the comparator outputs, to the controller 50, an overheat blocking signal indicating that the FET 12 is in an overheated state. If the overheat blocking signal is output from the comparator 54, the controller 50 determines that the FET 11 is in an overheated state and sets the FET 11 to OFF. On the other hand, in a case where the forward voltage Vfa of the body diode D2 is higher than the voltage threshold value Vt, since the temperature of the body diode D2 is relatively low, the comparator 54 does not output the overheat blocking signal to the controller 50. As described above, in the case of performing the precharge control, the semiconductor switch control device 1C according to the second embodiment does not use the forward current Ib but changes from the forward voltage Vfa of the body diode D2 of the FET 12 to the temperature of the body diode D2. In a case where the precharge control is performed, as illustrated in FIG. 7, the controller 50 applies the precharge voltage to the FET 11 at time t10 in the state where the FET 12 is set to OFF, so that the forward current Ib as a constant current is allowed to flow.

As described above, in the semiconductor switch control device 1C according to the second embodiment, in a case where the precharge control is performed by the precharge circuit 33, the temperature state of the FET 11 (the minus-side main relay 10B) is determined from the forward voltage Vfa of the body diode D2 of the FET 12 and the voltage threshold value Vt that determines the temperature of the body diode D2 of the FET 12. Therefore, in a case where the precharge control is performed, the semiconductor switch control device 1C can determine the temperature of the body diode D2 based on the forward voltage Vfa of the body diode D2 without using the forward current Ib. As a result, there is no need to calculate the temperature of the body diode D2 by using the forward current Ib and the forward voltage Vfa. As a result, since the amount of calculation of the semiconductor switch control device 1C is smaller than that of the semiconductor switch control device 1 (1A, 1B) according to the first embodiment, it is possible to easily calculate the temperature of the body diode D2. Although the semiconductor switch control device 1C determines the temperature state of the FET 11 on the basis of the forward voltage Vfa and the voltage threshold value Vt, the temperature state of the minus-side main relay 10B including the FET 11 may be determined.

Modified Example

Next, Modified Example will be described. Although the semiconductor switch control device 1 has been described with reference to the example where the temperature state of the minus-side main relay 10B is determined, the configuration where the temperature state of the plus-side main relay 10A is determined may be used.

In addition, although the example where the source terminals of the FET 11 and the FET 12 are connected in series with each other has been described, the present invention is not limited thereto. For example, the drain terminals of the FET 11 and the FET 12 may be connected in series with each other. In this case, with respect to the FET 11 and the FET 12, the source terminal of the FET 11 is connected to the high voltage battery 3, and the source terminal of the FET 12 is connected to the high voltage load 2.

Although the example of discharging the high voltage battery 3 has been described, the present invention can also be applied to the example of charging the high voltage battery 3 with the high voltage load 2. In the case of charging the high voltage battery 3, the direction of the forward current Ib is opposite to the direction in which the high voltage battery 3 is discharged. In this case, the forward current Ib flows from the minus side of the high voltage battery 3 toward the high voltage load 2. In the case of charging the high voltage battery 3, the body diode D1 is arranged in the forward direction which is the direction in which the forward current Ib flows, so that the FET 11 functions as a forward switch for detecting the temperature. In the case of charging the high voltage battery 3, the body diode D2 is arranged in the direction opposite to the direction in which the forward current Ib flows, so that the FET 12 functions as a backward switch for conducting or blocking the current. The controller 50 measures the temperature of the body diode D1 by detecting the forward voltage Vfa of the body diode D1 of the FET 11 and determines the temperature state of the FET 12 based on the measured temperature of the body diode D1.

In addition, since the FET failure detector 53 is used for determining a failure of the FET 12, it is not necessary to regard the FET failure detector as an essential component for determining the temperature state of the FET 11.

In addition, the semiconductor switch control device 1 may be applied to circuits other than the high voltage circuit having the high voltage battery 3 and the high voltage load 2. For example, the semiconductor switch control device 1 may be applied to a DC-DC converter circuit to determine a temperature state of a switching element of the DC-DC converter circuit.

In a semiconductor switch control device according to the embodiment, by determining a temperature state of a semiconductor switch module based on a forward voltage of a body diode of a forward switch, it is possible to accurately determine the temperature state of the semiconductor switch module.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A semiconductor switch control device comprising:
a semiconductor switch module provided between a power supply and a load and configured to conduct or block a current flowing between the power supply and the load;
a precharge circuit that controls the semiconductor switch module, and allows a constant precharge current to flow and prevents an inrush current; and
a controller configured to control the semiconductor switch module, wherein
the semiconductor switch module includes
a forward switch having a body diode arranged in a forward direction which is a direction in which the current flows, and
a backward switch arranged adjacent to the forward switch and having a body diode arranged in a direction opposite to the direction in which the current flows,
in the forward switch and the backward switch, each of which includes a source terminal and a drain terminal, the source terminals are connected in series to each other, one drain terminal is connected to the power supply and the other drain terminal is connected to the load, or the drain terminals are connected in series to each other, one source terminal is connected to the power supply and the other source terminal is connected to the load,
the precharge circuit applies a precharge voltage to the backward switch to allow a constant precharge current to flow, the precharge voltage is smaller than a voltage after a diagnostic period for diagnosing abnormality of the semiconductor switch module, and
in a case where precharge control is performed by the precharge circuit, the controller determines an overheating of the semiconductor switch module from a forward voltage of the body diode of the forward switch and a threshold value that determines a temperature of the body diode of the forward switch.

2. The semiconductor switch control device according to claim 1, wherein the controller determines the temperature state of the semiconductor switch module from a temperature of the body diode of the forward switch obtained based on the forward voltage of the body diode of the forward switch and the current flowing in the forward switch.

3. The semiconductor switch control device according to claim 2 wherein in a case where the forward voltage of the body diode of the forward switch is out of a range of a reference voltage which is a reference of the forward voltage before determining the temperature state of the semiconductor switch module, the controller determines that the forward switch has a failure and turns off the backward switch to block the current.

4. The semiconductor switch control device according to claim 1, wherein in a case where the forward voltage of the body diode of the forward switch is out of a range of a reference voltage which is a reference of the forward voltage before determining the temperature state of the semiconductor switch module, the controller determines that the forward switch has a failure and turns off the backward switch to block the current.

* * * * *